United States Patent
Nagazumi

[11] Patent Number: 5,987,491
[45] Date of Patent: *Nov. 16, 1999

[54] GENERAL PURPOSE CHARGE MODE ANALOG OPERATION CIRCUIT

[75] Inventor: Yasuo Nagazumi, 6-14-20 Ootsuka, Bunkyo-ku, Tokyo, Japan

[73] Assignees: G.D.S. Co., Ltd.; Yasuo Nagazumi, both of Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/550,653

[22] Filed: Oct. 31, 1995

[30] Foreign Application Priority Data

Oct. 31, 1994 [JP] Japan .................................. 6-290537

[51] Int. Cl.$^6$ .......................................................... G06G 7/00
[52] U.S. Cl. ............................................................. 708/801
[58] Field of Search ................................... 364/807, 602; 708/801, 3

[56] References Cited

U.S. PATENT DOCUMENTS

| | | |
|---|---|---|
| 4,464,726 | 8/1984 | Chiang . |
| 5,089,983 | 2/1992 | Chiang .................................... 364/602 |
| 5,113,365 | 5/1992 | Yang ....................................... 364/807 |
| 5,247,472 | 9/1993 | Nagazumi .............................. 364/807 |
| 5,506,801 | 4/1996 | Tawel ...................................... 364/807 |
| 5,508,538 | 4/1996 | Fijany et al. ............................ 364/807 |
| 5,539,404 | 7/1996 | Nagazumi . |

FOREIGN PATENT DOCUMENTS

| | | |
|---|---|---|
| 5-032792 | 5/1993 | Japan . |
| 5-143567 | 6/1993 | Japan . |
| 6-200255 | 6/1994 | Japan . |
| 6-237173 | 8/1994 | Japan . |
| 6-350451 | 12/1994 | Japan . |
| 6-350453 | 12/1994 | Japan . |
| 7-141454 | 6/1995 | Japan . |

OTHER PUBLICATIONS

Microelectronics, Second Edition, Jacob Millman and Arvin Grabel, McGraw–Hill International Editions 1987, Electronic Engineering Series, pp. 67–118.

Solid State Imaging Arrays, San Diego, California, U.S.A., 22–23, Aug. 1985, vol. 570, ISSN 0277–786X, Proceedings of the SPIE—The International Society for Optical Engineering, 1985 USA, pp. 191–197, XP000677138 Lamb D R et al: "Analog array processing of PtSi focal plane imagery" *p. 191, line 21–line 23* *p. 192, line 26–line 33*.

Patent Abstracts of Japan, vol. 017, No. 532 (P–1619), Sep. 24, 1993 & JP 05 143567 A (G D S:KK; Others: 01), Jun. 11, 1993, *abstract*.

Jia–Yuan Han, "Multiple Valued VLSI and Systolic Array With CCD Realization," pp. 67–118, Progress in Computer–aided VLSI design; vol. 3, Implementations; Ablex Publishing, Norwood, NJ, USA, 1989.

Hans G. Kerkhoff et al., "Multiple–Valued Logic Charge–Coupled Devices," IEEE Transactions on Computers, vol. C–30, No. 9, Sep. 1981, pp. 644–652.

Primary Examiner—Tan V. Mai

[57] ABSTRACT

A general purpose charge mode, analog operation circuit provides adder, multiplier, divider (D/A converter) and other functions using a single hardware configuration to be used in different modes. A two-dimensional lattice circuit including electrical charge transfer devices, each driven by charge transfer electrodes, all or a portion of which having structures allowing independent control, and a plurality of the electrical charge transfer devices adjacent to each other in the circuit are controlled successively with respect to the analog circuit charge signals to provide operation functions such as addition, multiplication, division, and sign inversion.

16 Claims, 13 Drawing Sheets

GENERAL PURPOSE CHARGE MODE ANALOG OPERATION CIRCUIT

BACKGROUND OF THE INVENTION

1. Field of the Invention

The present invention concerns general purpose charge mode analog operation circuit for attaining, on the same hardware, an adder, multiplier, divider (A/D converter) and other functions according to the difference of their operation status.

2. Description of the Prior Art

Recent developments in digital technology have achieved massive and systematic stacks of microscopic structures of extremely simple elements based on cascadic signal processing modes unified by a simple standard referred to as binary logic.

On the other hand, miniaturization and pursuit of higher speed of digital circuits through the development of processing technology tends to increase power consumption giving rise to more serious problems of supplying more power and handling greater heat dissipation.

Analog technology however utilizes the interaction of devices, so that standardization is difficult and developments with respect to miniaturization or introduction higher functions is extremely slow compared with digital technology.

However, systems involved with physical phenomena must always have some portion for handling analog signals, and in many cases depending on the objective, it is more efficient in terms of cost, power consumption and accuracy to process directly an analog signal, rather than use digital technology. However progress is needed towards standardized processing in analog circuits in the future to conquer current problems such as variations in accuracy, drift and circuit size.

The charge transfer device is particularly unique among devices because of its ability to handle a sampled analog signal so as to enable information processing; essentially of the cascade type, and having properties making it ideal for analog circuit standardization along with extremely low power consumption.

Though slightly differing from the topic of analog signal processing, it has been proposed to use a CCD, which is one kind of charge transfer device, as multi-value memory and arrange them in arrays for use in a digital processing system (please refer to: J. HAN; PROGRESS IN COMPUTER-AIDED VLSI DESIGN; VOL.3; IMPLEMENTATIONS; pp.67–118; ABLEX PUBLISHING, 1989 or H. G.KERKHOFF et al.; IEEE trans. on Computers, C-30, No.9; 1981; PP.644–652), however, as a result of abandoning the advantage of charge transfer device of "enabling analog signal processing", the configuration becomes complex and many restrictions are imposed without realizing a sufficient function, so that the CCD has not been widely used in this field.

On the other hand, efforts have been made elsewhere implementing a multiplier using a CCD. As shown in FIG. 13, for example, Chiang et al. have prepared charge input gates of the number corresponding to bit number, manufactured by way of a trial a multiplier wherein multiplication type D/A conversion is performed by adding signals in the charge domain, and confirmed some performance. [Please refer to: (U.S. Pat. No. 4,464,726 CHARGE DOMAIN PARALLEL PROCESSING NETWORK (A. M. CHIANG 1984) or U.S. Pat. No. 5,089,983 CHARGE DOMAIN VECTOR-MATRIX PRODUCT PROCESSING SYSTEM (A. M. CHIANG 1992).]

Now, as shown in FIG. 14, the inventors have proposed a method comprising a multiplication type converter by directly dividing the charge input and selectively accumulating them according to a digital signal bit and, moreover, have proposed an A/D converter of similar composition. [Please refer to: Tokkaihei No.6-237173, "D/A converter or multiplier using charge transfer device", Tokuganhei No. 5-154513, "D/A converter for charge signal", Tokuganhei No. 5-154514, "A device for dividing charge signal into two equal parts", Tokuganhei No. 5-312640, "Systolic array processor", Tokuganhei No. 6-200255, "Multiplier using charge transfer device".]

All these embodiments have a specialized configuration for achieving a single function and do not have flexibility for allowing to a multiplier used as an adder; however among them, the system proposed by the inventors is relatively easy to standardize because of its simple composition.

SUMMARY OF THE INVENTION

The object of the present invention is to provide a general purpose charge mode analog operation circuit comprising a standardized circuit structure allowing the circuit to perform more complex and flexible general functions through an effective use of charge transfer devices, finite resources on the circuit, and by using selectively for different operation functions.

This is different from the basic concept of conventional operations unit wherein operations are performed by transferring data to a specialized operation function section, this system permits the desired operation function to be performed where the data is present (operation functions move while the data is immobile) and thus, to reduce the time necessary for data transfer in operations whose processing is performed depending on local data so as to obtain a general purpose charge mode analog operation circuit for allowing these operations to be performed more effectively.

The present invention is made in consideration of these points and is intended to provide a general purpose charge mode analog operation circuit composed of a two-dimensional lattice circuit comprising charge transfer devices wherein all or part of the charge transfer electrodes for driving respective device may be controlled independently and wherein addition, multiplication, division, storage, delay, sign inversion or other operation functions of analog charge signals on the circuit are performed by co-operative control of a plurality of adjacent charge transfer devices on the circuit.

DETAILED DESCRIPTION OF THE PREFERRED EMBODIMENT

Now, the composition of one embodiment of the invention will be described with its functions while referring to drawings.

Figure 1:
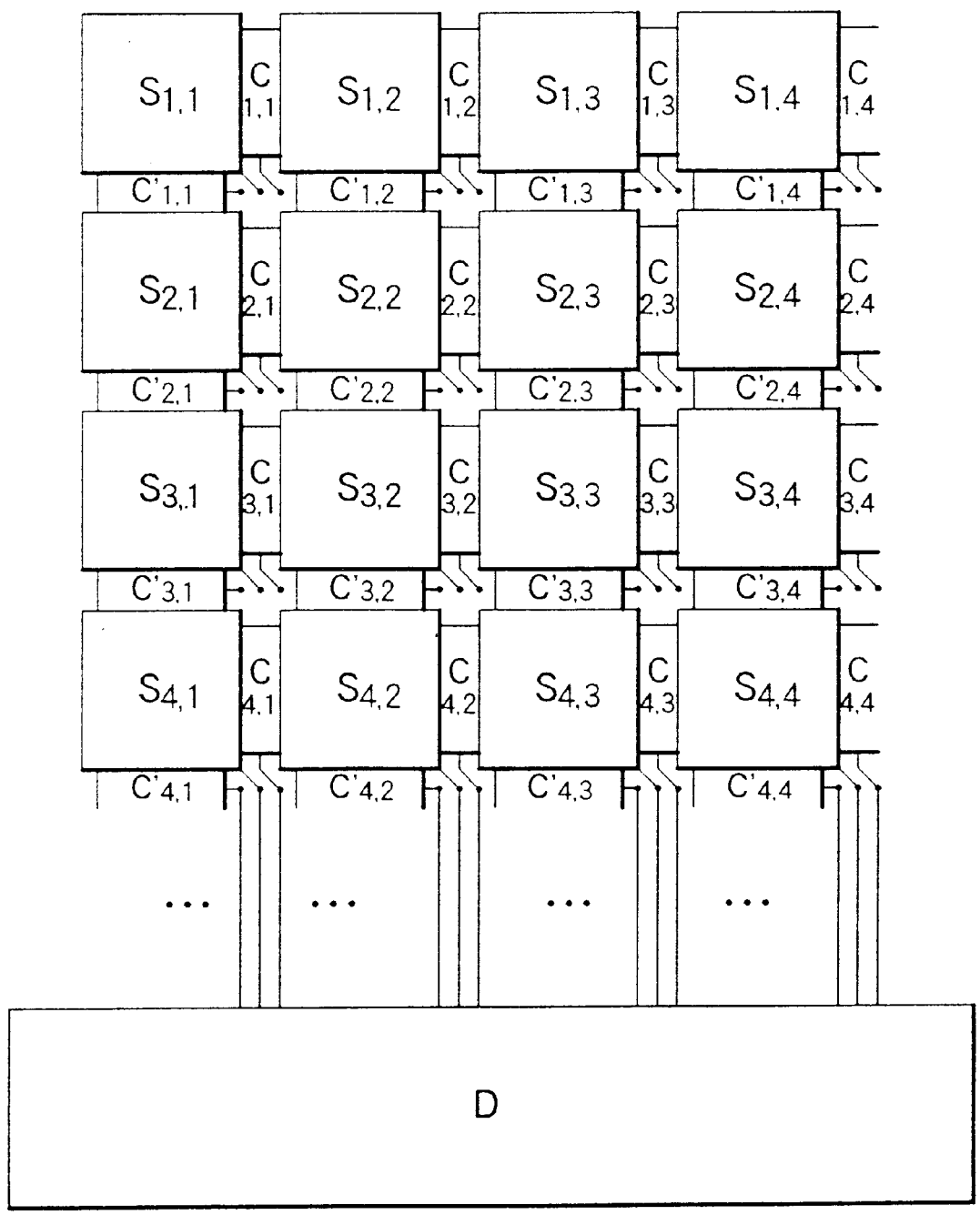
FIG. 1 is a circuit diagram illustrating the CCD operation device according to an embodiment of the invention.

FIG. 1 illustrates an embodiment of the simplest CCD operation unit of the invention. In this figure, a storage gate Sij is arranged at the lattice point of a square lattice and control gates Cij, C'ij connect adjacent storage gates along the lattice. Here, both storage gate and control gates are provided with a function of defining potential wells in the underlying semi-conductor substrate according to the applied potential and the control gate connects or disconnects potential wells of two adjacent storage gates.

Figure 2:
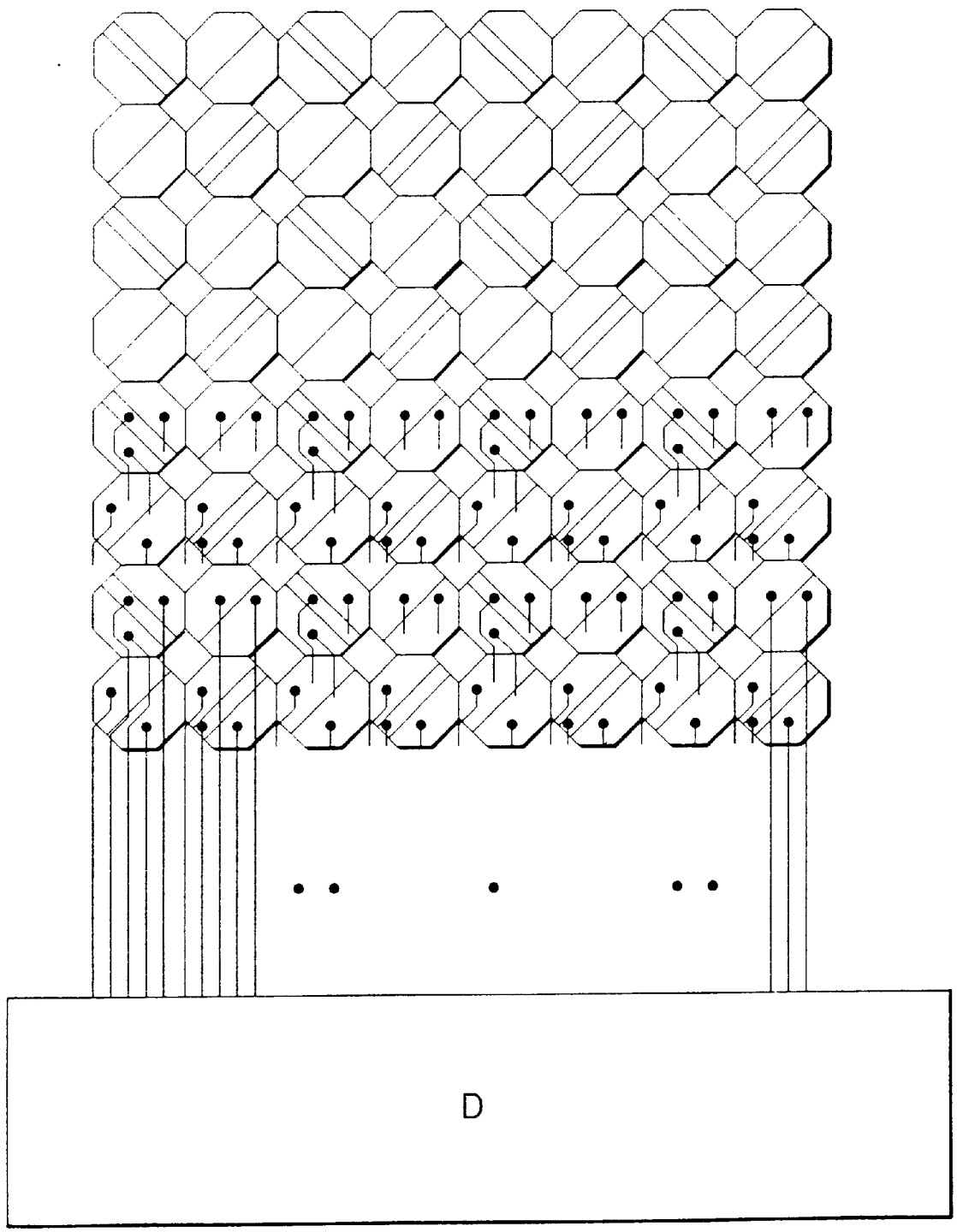
FIG. 2 is a circuit diagram of a CCD operation device showing a lattice according to another embodiment of the invention.

FIG. 2 illustrates an embodiment of a CCD operation unit having a relatively complex lattice, wherein the lattice structure is basically composed of storage gates including a small number of control gates arranged among them. In this embodiment, all these gates are connected to a driving control circuit D through independent input terminals and all the desired functions are selected by the operation mode of circuit D. To make the illustration simple, only portions of the connections are shown.

The operation unit of FIG. 1 and. FIG. 2 may be used for performing the following various operations according to its control mode.

(1) D/A conversion, two-quadrant multiplication, four quadrant multiplication
(2) A/D conversion, floating point division
(3) Block addition
(4) $2^N$ equal divider
(5) Inverter
(6) Data transfer line, delay line
(7) Spatial data parallel rearrangement Now, specific examples of implementation of analog operation units of various functions will be described.

Figure 3:
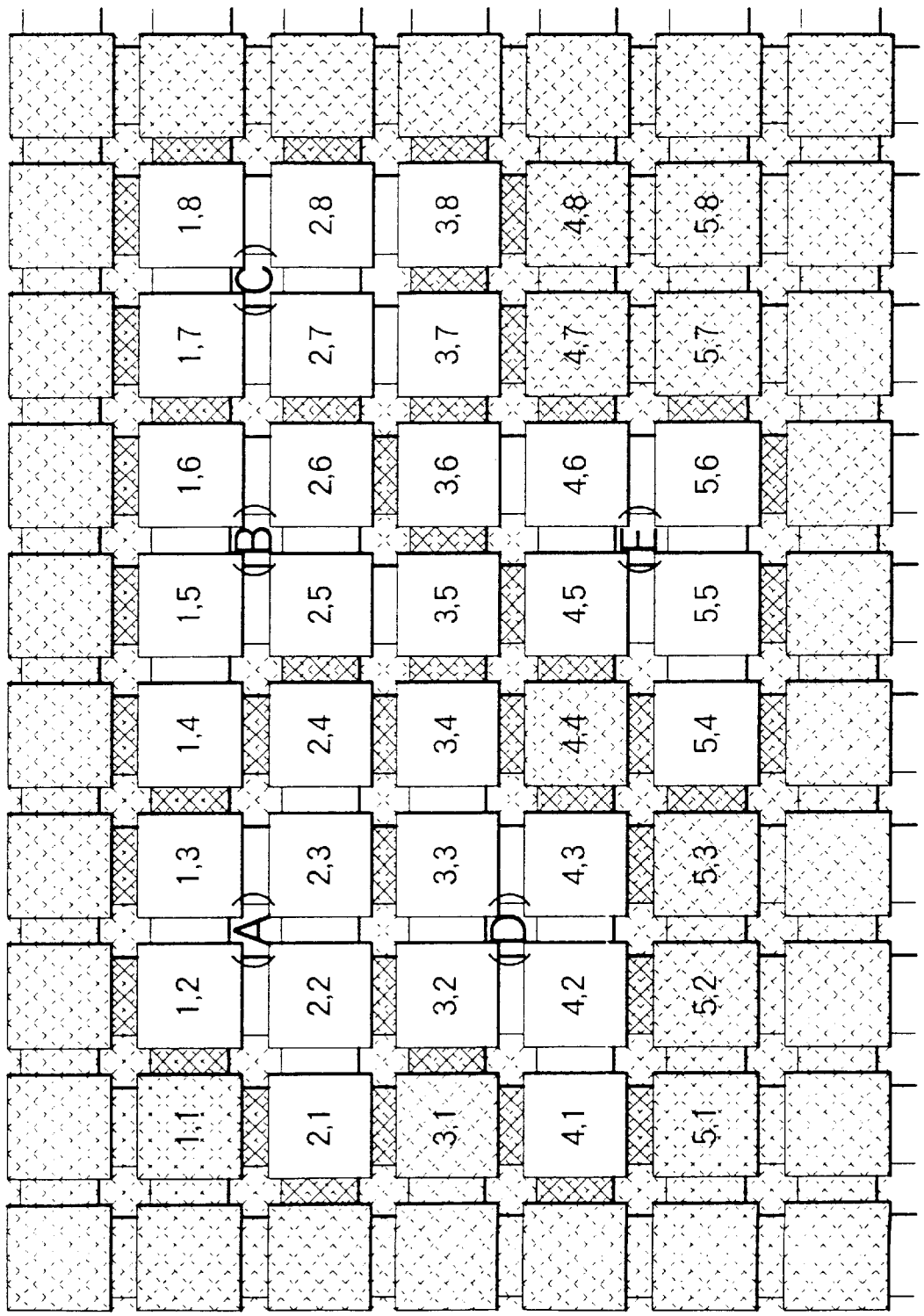
FIG. 3 is a circuit diagram of a composition wherein a conventional two-quadrant D/A converter is implemented in a lattice circuit for illustrating various converters of the invention.
Figure 14:
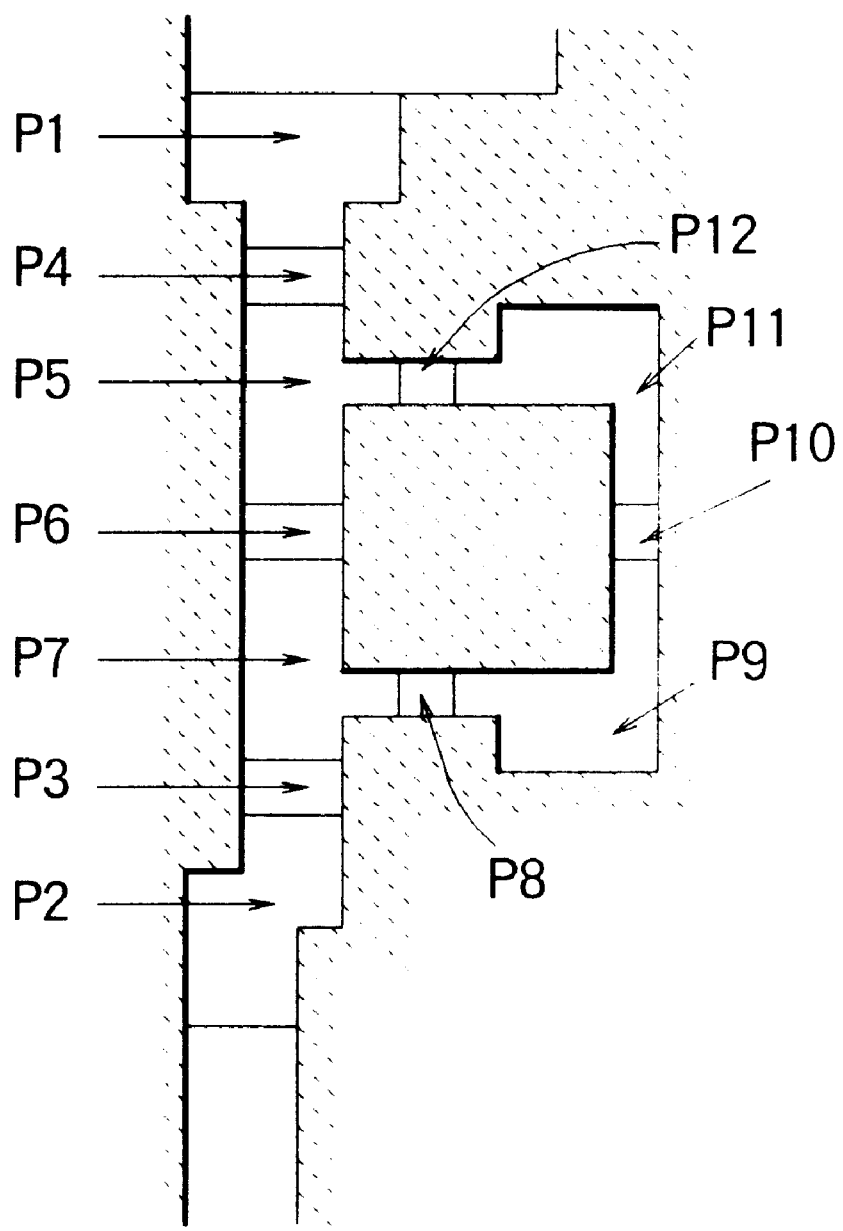
FIG. 14 is a circuit diagram showing a multiplication type D/A converter composed of operations for directly dividing conventional charge input and selectively accumulating charges according to digital signal bit.

FIG. 3 illustrates various converters composed by implementing a two-quadrant D/A converter equivalent to the D/A converter shown in FIG. 14 in the lattice circuit. In the figure, hatched areas indicate inactive gates where the formation of potential well is always inhibited and sections surrounded in the hatched areas correspond to areas for executing various operations.

Figure 11:
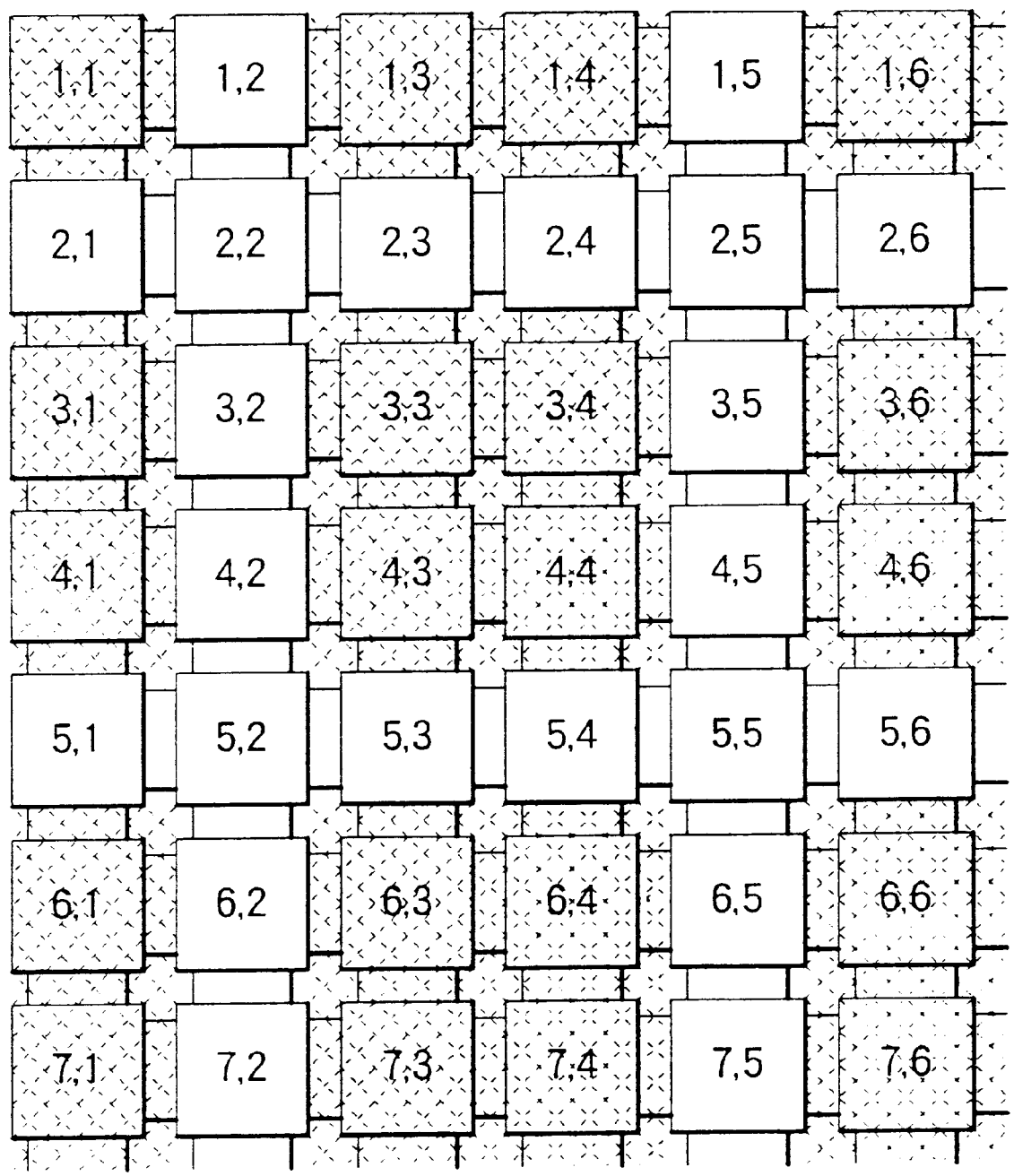
FIG. 11 is a circuit diagram showing an embodiment of an implementation of spatial data rearrangement mechanism based on Tokkaihei No. 5-143567, "Spatial information rearrangement unit" of the invention.

The same representation method shall be applied to respective examples shown in up to FIG. 11.

In figures, three types (A), (B) and (C) are converters topologically equal to FIG. 14 and (D) and (E) are converters of a type slightly modified from the same.

The function of this unit shall not be explained herein, because it is described in detail in Tokkaihei No.6-237173, "Application of D/A converter of multiplier using charge transfer device", Tokuganhei No.5-154514, "Unit for equally dividing charge signal" and Tokuganhei No.6-200255, "Multiplier using charge transfer device".

Figure 4:
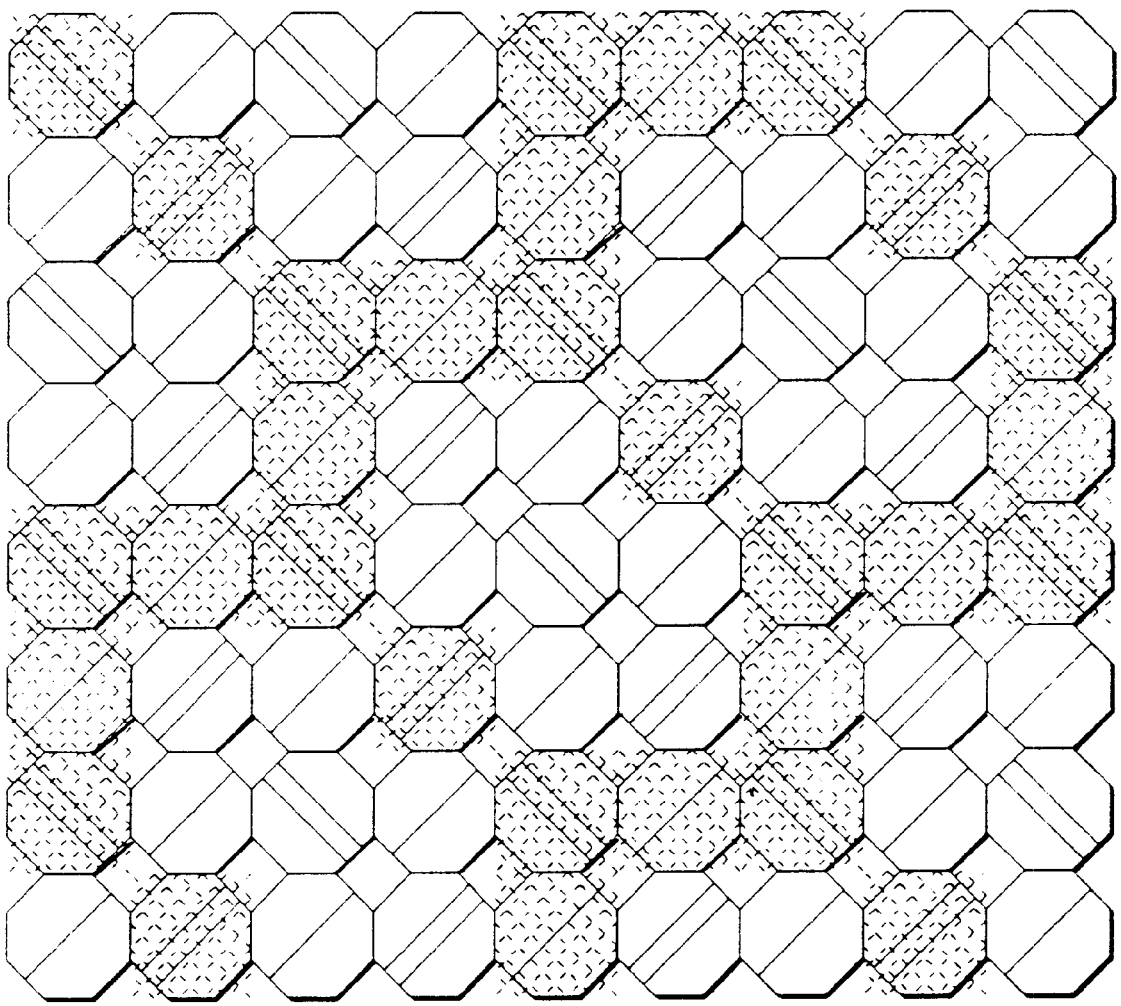
FIG. 4 is a circuit diagram showing a composition wherein a two-quadrant D/A converter made up of a unit for equal division is implemented in parallel on the lattice of FIG. 2.

FIG. 4 shows the composition wherein a two-quadrant D/A converter comprising the unit for equal division, however, as its function is similar to FIG. 3, its detailed explanation is omitted.

Figure 5:
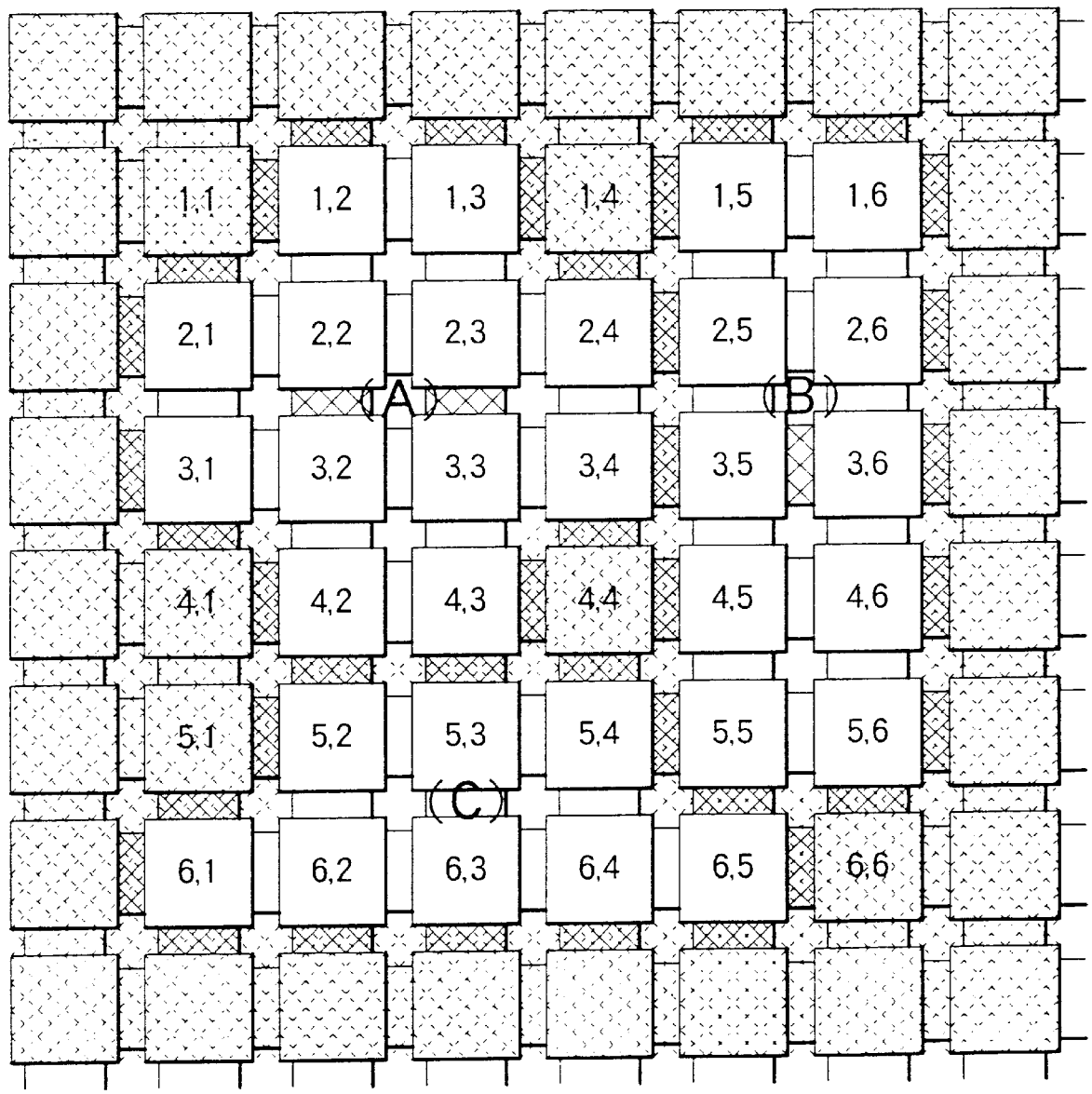
FIG. 5 is a circuit diagram showing a composition of the implementation of a four-quadrant D/A converter based on Tokuganhei No. 6-200255, "Multiplier using charge transfer device" on the lattice of FIG. 2.

In the same way, FIG. 5 shows an embodiment of implementation of a four-quadrant D/A converter based on Tokuganhei No.6-200255, "Multiplier using charge transfer device". Among the three types of converters shown in the figure, (A) and (B) compose the four-quadrant D/A converter shown in Tokkaihei No. 6-237173, "Application of the D/A converter or multiplier using charge transfer device" and Tokuganhei No.6-200255, "Multiplier using charge transfer device" by combining two converters (A) and (C) shown in FIG. 3, while (C) is an embodiment of direct implementation of the composition shown in FIG. 6 of Tokuganhei No.6-200255, "Multiplier using charge transfer device".

Figure 6:
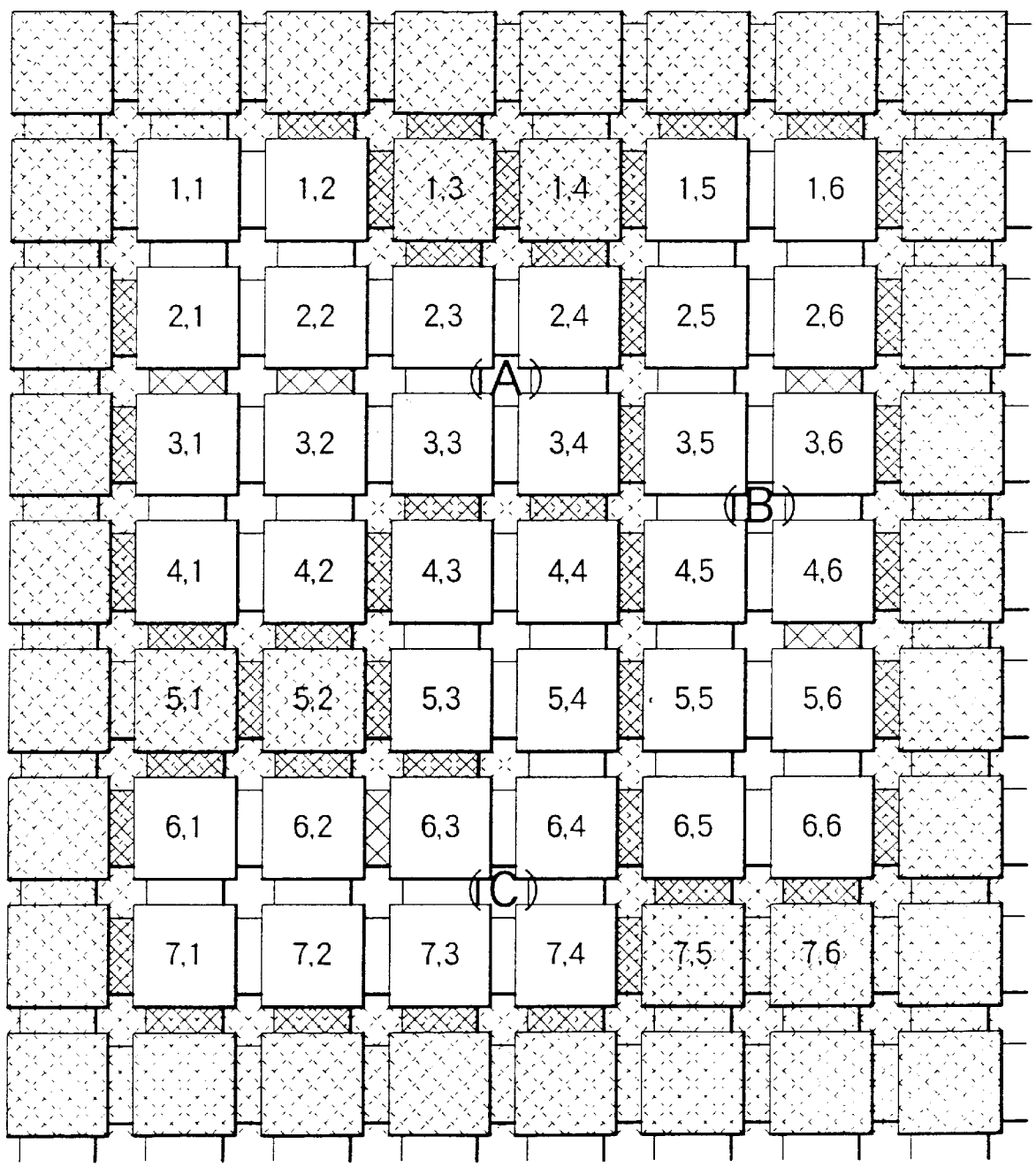
FIG. 6 is a circuit diagram showing the implementation of an embodiment of floating decimal point division type A/D converter of the invention.

FIG. 6 shows an embodiment of implementation of floating point division type A/D converter. The essential function of this embodiment is similar to that shown in Tokuganhei No. 5-154513, "A/D converter for charge signal", however, a reiterative divider is installed also for the input signal, and ½ operation is added both to the input signal and the reference signal immediately after the beginning of the conversion and a function for forming exponent portion has been added.

Figure 7A:
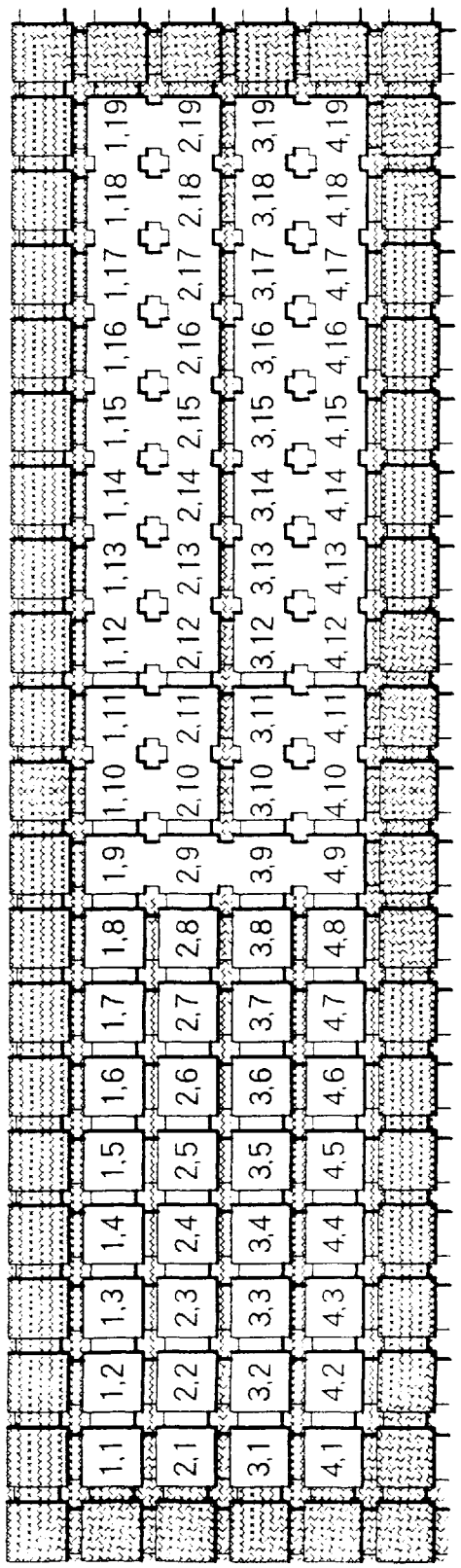
FIG. 7A is a circuit diagram of an embodiment of 4×4 block adder for 16 pairs of differential signal.
Figure 7B:
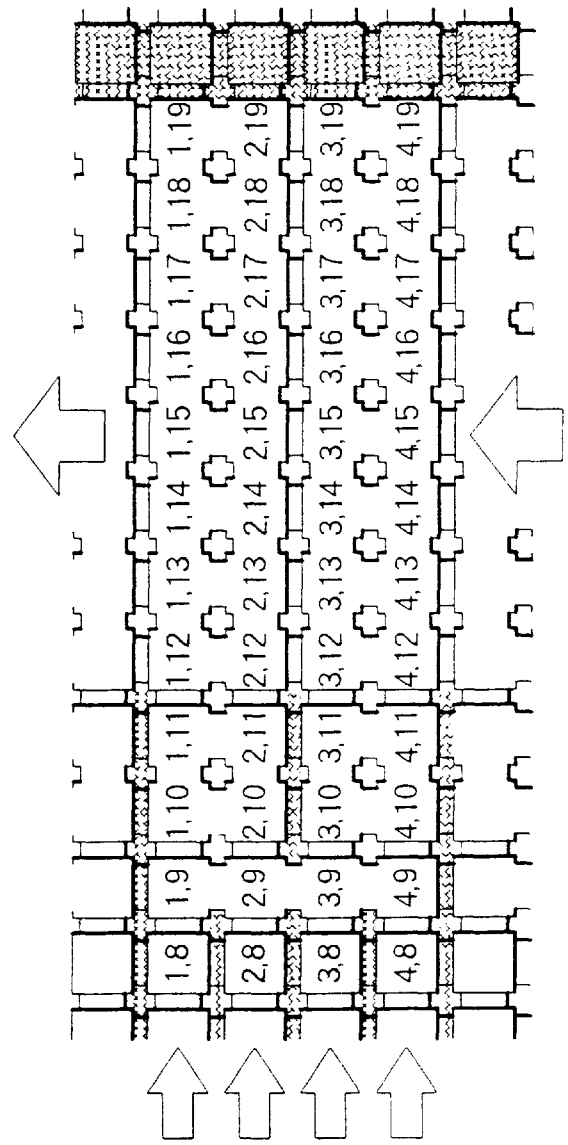
FIG. 7B is a circuit diagram of another embodiment of 4×4 block adder.

Both FIG. 7A and 7B show an embodiment of implementation of 4×4 block adder for the differential signal.

In FIG. 7A, the leftmost 32 gates maintain 16 differential input signals in the initial state, and allocate the positive and negative components of the differential signal to $S_{i, 2j-1}$ and $S_{i,2j}$, respectively, where i=1,2, . . . ,8 and j=1,2, . . . 8.

Moreover, two fused potential wells shown at the right end of FIG. 7A define output buffers for accumulating positive and negative components respectively. A total of 32 input signal packets are added 4 by 4 in fused addition gates (S1,9; S2,9; S3,9; S4,9) by the shift operation toward the right. This charge signal is transferred alternatively to one of the two fused gate (S1,10; S1,11; S2,10; S2,11) or (S3,10; S3,11; S4,10; S4,11) and is accumulated in two output buffers. As a consequence, 16 sets of differential signals are added for each component and output in the two buffers.

The composition of FIG. 7B allows it to perform pipeline operation by replacing the input/output portion of FIG. 7A with a shift register.

Figure 8:
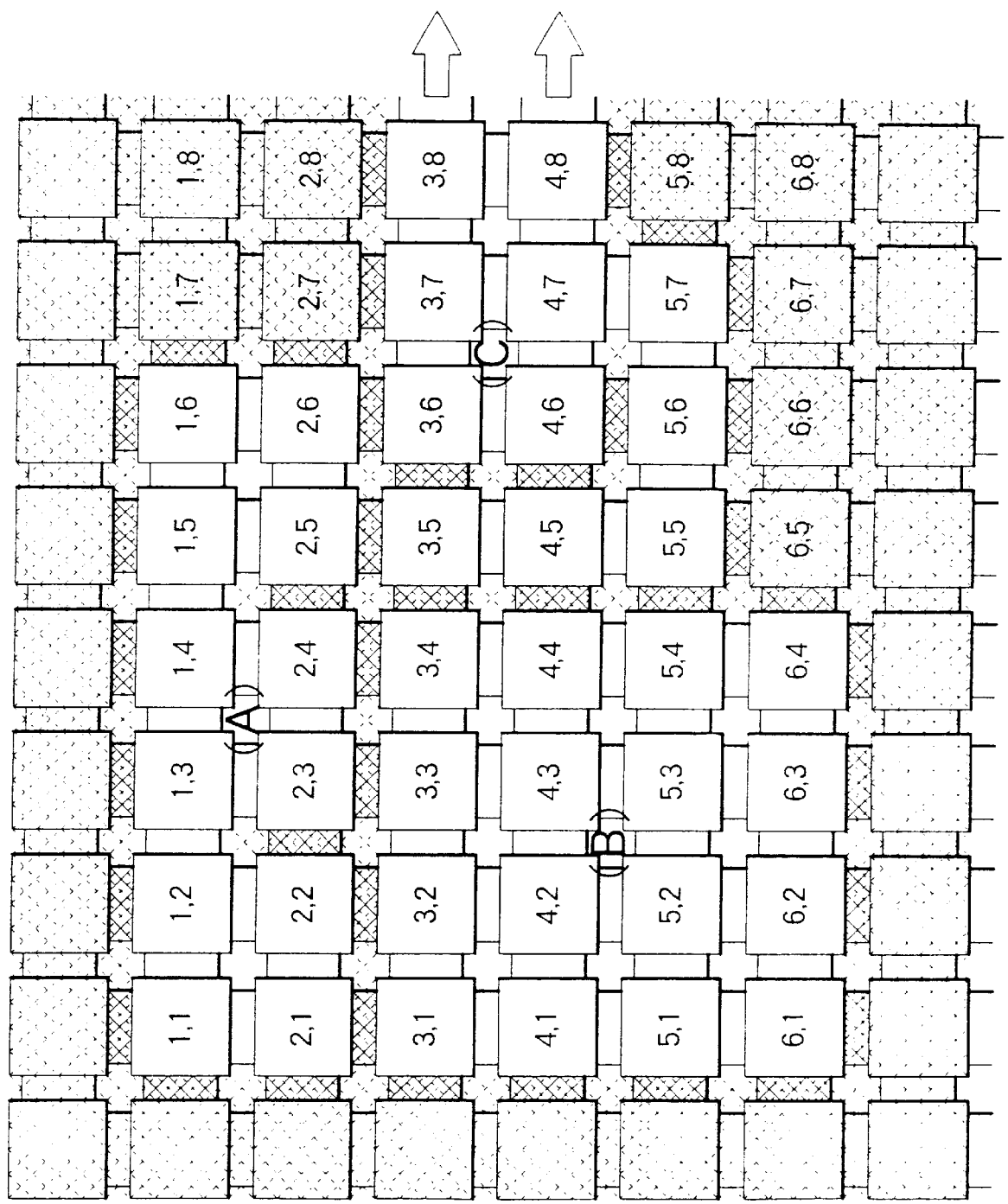
FIG. 8 is a circuit diagram showing the implementation of an embodiment of a circuit for equally dividing a charge packet into 4, 8, or 64 parts.

FIG. 8 shows an embodiment of implementation of the circuit for equally dividing a charge packet into 4, 8 or 64 parts.

The circuit (A) in FIG. 8 illustrates a parallel type unit for division into four equal parts.

Three units for dividing into two equal parts composed respectively by four storage gates S11, S12, S21, S22; S13, S14, S23, S24; S15, S16, S25, S26 are linked together through tree structure and an input charge introduced into S13+S14 is divided by the middle unit for division into two equal parts and its output is again divided by the right and left units for dividing into two equal parts and is finally divided into four equal parts and output to respective gates S11, S12, S15 and S16.

As the equal division unit of this method requires ($2^N-1$)×4 storage gates for $2^N$ equal division, a large circuit area would be necessary for larger N, but as it is executed through pipeline type processing, the equal division unit has really the highest processing rate.

The circuit (B) in FIG. 8 represents an unit for dividing into eight equal parts of a semi parallel type. This example is obtained by sequentially performing three types of division operations into two equal parts.

First, four storage gates of respective S31, S32, S41, S42; S33, S34, S43, S44; S51, S52, S61, S62; S53, S54, S63, S64 begin the operation in a mode for defining continuously four large potential wells respectively. When the division into two equal parts is completed in this mode, the division result shall be arranged in two large potential wells of, for instance, S31, S32, S41, S42; S51, S52, S61, S62.

Next, the operation of C'41-44, it is separated into two upper and lower units for division into two equal parts providing a half the capacity of the initial one.

The one is composed of four potential wells coupled two by two, S31, S32; S41, S42; S33, S34; S43, S44 and the other is composed of S51, S52; S61, S62; S53, S54; S63, S34 respectively, and two storage gates are coupled to define a potential w ell.

Finally, the charge signals divided into four equal parts by this division are divided respectively into two equal parts by four units for division into two equal parts composed of S31, S32, S41, S42; S33, S34, S43, S44; S51, S52, S61, S62; S53, S54, S63, S64 and finally are divided into a total of eight parts This This method requires a circuit size of about half the parallel method because it uses $2^{N+1}$ storage gates for division into $2^N$ equal parts, but the charge density variation at each gate of signal charge is substantially kept constant because the effective gate capacity of the divisions is reduced with a count of the division trails.

But, the processing rate is slower than the parallel type because pipeline processing is not used.

The circuit (c) FIG. 8 shows a serial type unit for dividing into 64 equal parts.

In this system, a unit for dividing into two equal parts composed of eight gates, S36, S37, S46, S47, C36, C46, C36, C'37 is connected to an analog data stack composed of ten gates, S57, S56, S55, S45, S35, C56, C55, C'47, C'45, C'35 and the charge signal applied initially to S37, S47 pushes half charge signal of the result from divisions sequentially into the stack until the result from division into two equal parts attains 1/64, then when it attains 1/64, two packets, result of division, are discharged outside along the arrow and the operation of returning the last data popped out from the stack to the unit for dividing into two equal parts is reiterated to perform the division into 64 equal parts.

This method advantageously allows to modify the function from division into 4 equals parts, to division into 64 equal parts through operation procedure, however, a low speed due to serial operation and an irregular output timing interval are its drawbacks.

Figure 9:
FIG. 9 is a circuit diagram showing an embodiment of an implementation of a data transfer register of the invention acting also as delay circuit.

FIG. 9 shows a embodiment of implementation of an simple shift register for data transfer that also acts as a delay circuit.

Naturally, it can be used also as analog data stack as in the circuit (C) shown in FIG. 8 by driving the shift register in the opposite direction on the way.

Figure 10:
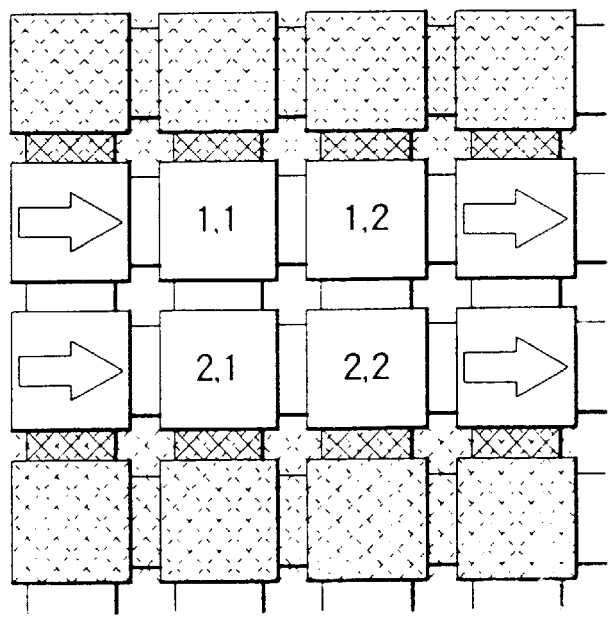
FIG. 10 is a circuit diagram showing an embodiment for exchanging the arrangement of two charge signals of the invention.

FIG. 10 shows a circuit for exchanging the arrangement of two charge signals which also acts as an inverter for reversing the sign if the two charge signals are differential types and moreover, it also serves as basic logic element for calculating outputs from FUZZY AND or FUZZY OR gates, if two signals are one element of fuzzy variables and one element of membership functions. [For the detail, please refer to: U.S. Pat. No. 5,247,472, "FUZZY LOGIC OPERATION CIRCUIT UTILIZING CHARGE COUPLED DEVICES" and Tokkouhei No. 5-32792, "Fuzzy operation circuit and fuzzy computer using the same".]

FIG. 11 shows an embodiment of implementation of spatial data rearrangement mechanism based on Tokkaihei No.5-143567, "Spatial information rearrangement unit".

In this embodiment, each of control gates C, C' acts depending on either of adjacent storage gates, to perform a rapid data transfer as three phase CCD as the whole and also permits transfer of the signal in the opposite direction only by just changing the transfer clock phase.

FIG. 12A, 12B, 12C, 12D show the relation between CCD lattice circuits M and control circuit D. On a lattice circuit utilizing CCD, as mentioned above, various functions may be obtained, but these functions are defined mainly by control signals for driving CCD.

Therefore, the utilization of user programmable type logic circuit like gate-array for said definition of functions enables to incorporate the device to many kind of applications.

Figure 12A:
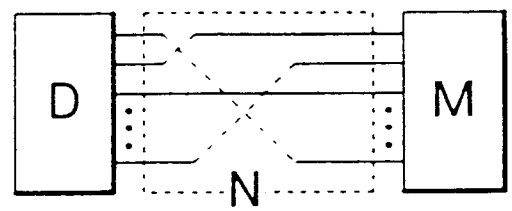
FIG. 12A is a diagram showing the connection network N between CCD lattice circuits and control circuits.

FIG. 12A shows an arrangement for setting the connection N between control signal source and respective gate according to the object by using only a metal wiring process of the IC manufacturing processes during user programmable portion and is the method commonly used for gate arrays and others.

Figure 12B:
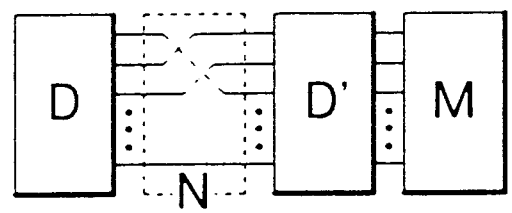
FIG. 12B is a diagram showing the connection network N between main control circuit D and distributed control circuit D which controls CCD lattice circuits.

In general, when the number of gates increases, such a composition is required wherein the control circuit is divided into circuit group D' and distributed over the lattice circuit for reducing the amount of wiring, as shown in FIG. 12B.

Figure 12C:
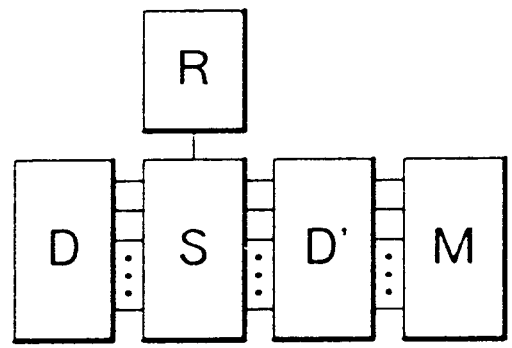
FIG. 12C is a diagram showing the programmable connection network S with connection program memory R.

FIG. 12C shows an example of programming the connection between a control circuit and respective gates using a switch mechanism provided with a memory device R including EPROM in place of the connection N.

Figure 12D:
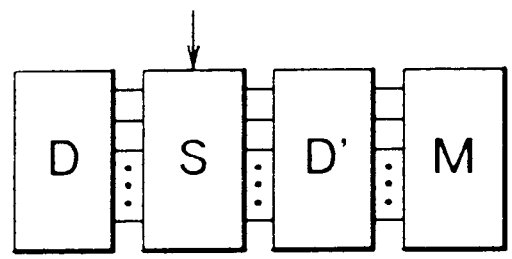
FIG. 12D is a diagram showing the programmable connection network S controlled by the signal supplied from outside the chip.
Figure 13:
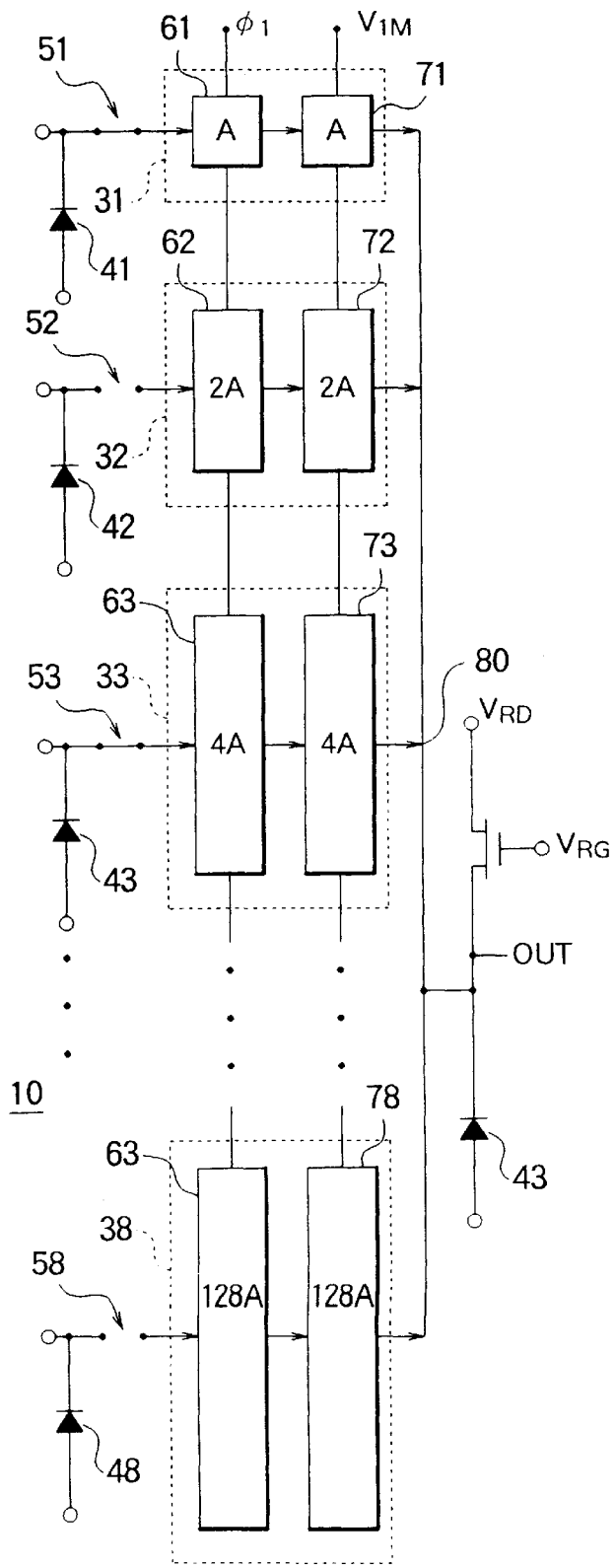
FIG. 13 is a circuit diagram showing a multiplier of a structure for performing multiplication type D/A conversion by providing a charge input gate of the number corresponding to the conventional bit number and by adding in charge domain.

FIG. 12D shows an embodiment of the connection among a control circuit and respective gates using a switch mechanism S which can be electrically controlled from outside. In this embodiment, the function of whole the circuit may be set arbitrary by using an external signal (arrow).

As clearly described here in before, the invention may be applied to analog operation processor, A/D conversion, D/A conversion or parallel processing for constructing general purpose analog signal processors which may perform various analog operation functions on a standardized CCD gate array allowing them, thereby, to provide already popular user programmable devices in the digital technology field and, also to be effectively utilized in image data processing because it may perform an operation out of conventional idea wherein operation functions are shifted by an appropriate composition without moving data so as to improve the efficiency of massive parallel type operation processing.

What I claim is:

1. A general purpose charge mode analog operation circuit comprising:

a two-dimensional lattice form circuit wherein a potential of all or part of charge transfer electrodes for driving a plurality of charge transfer devices are controlled independently, wherein addition, multiplication, division, sign inversion and other arithmetic operation functions are performed by cooperative control of the plurality of adjacent charge transfer devices in said two-dimensional lattice form circuit, and wherein at least one analog charge signal is input on said two-dimensional lattice form circuit prior to a beginning of each arithmetic operation function; and a driving control circuit for supplying a plurality of charge transfer control signals defining a control mode of said two-dimensional lattice form circuit to the charge transfer electrodes in said two-dimensional lattice form circuit, and thereby said plurality of charge transfer devices are controlled to selectively perform the arithmetic operation functions depending on the control mode.

2. The general purpose charge mode analog operation circuit of claim 1, further comprising means for measuring a level of a charge signal held by said general purpose charge mode analog operation circuit, with respect to at least a portion of the plurality of charge transfer devices.

3. The general purpose charge mode analog operation circuit of claim 2, further comprising a sample and hold circuit for storing a result of said means for measuring as a voltage signal and a comparator for comparing a magnitude of a voltage signal.

4. The general purpose charge mode analog operation circuit of claim 3, further comprising on the same chip, including said lattice circuit a digital signal processing circuit for performing digital operation functions using output signals of the comparator as inputs.

5. The general purpose charge mode analog operation circuit of claim 4, wherein an output of the digital signal processing circuit is used as control signal for charge transfer.

6. The general purpose charge mode analog operation circuit of claim 1, further comprising a two-dimensional lattice form circuit using a square lattice, said circuit being composed of a plurality of storage gates each of which is a charge transfer device arranged at each lattice point of the square lattice and a plurality of charge transfer devices each of which connects with two adjacent storage gates along the lattice.

7. The general purpose charge mode analog operation circuit of claim 6, wherein said plurality of charge transfer devices arranged on lattice points are used as storage gates and connected by a control gate.

8. The general purpose charge mode analog operation circuit of claim 1, wherein the driving control circuit is distributed on a location in an exterior or interior of said lattice form circuit.

9. The general purpose charge mode analog operation circuit of claim 8, wherein a connection between a respective control circuit and a respective device or connections among respective control circuits are selectively attained by a wiring process in a circuit fabrication process.

10. The general purpose charge mode analog operation circuit of claim 8, wherein a connection between a respective control circuit and a respective device or connection among respective control circuits is achieved by programmable semi-conductor devices such as a digital memory, and a circuit including means for selecting the function and determining the arrangement of functions electrically after the circuit is completed.

11. The general purpose charge mode analog operation circuit of claim 1, said general purpose charge mode analog operation circuit modifying an operation function and its allocation on said lattice form circuit according to the control mode, at least within a certain area on said lattice form circuit.

12. The general purpose charge mode analog operation circuit of claim 11, wherein a plurality of different operation functions are sequentially performed on a overlapping areas general purpose charge mode analog operation circuit and an Nth operation output is used as an N+1th operation input.

13. The charge mode analog operation circuit use of claim 1, further comprising input/output means for a charge signal such as a charge signal input gate or output gate on the same chip.

14. The general purpose charge mode analog operation circuit of claim 1, further comprising, on the same chips, a transducer for converting optical signals or other physical quantities into a charge signal for use as an input signal source.

15. The general purpose charge mode analog operation circuit of claim 1, wherein overflow of the charge signal is prevented by coupled control of a plurality of gates according to a quantity of the charge signals to be processed and by regulating a capacity of a potential well microscopically.

16. The general purpose charge mode analog operation circuit of claim 15, wherein transfer losses due to irregular potential of a respective gate is reduced by providing a suitable time difference in a drive timing of a plurality of gates.

* * * * *